(12) United States Patent
Shin (10) Patent No.: US 9,799,673 B2
(45) Date of Patent: Oct. 24, 2017

(54) SEMICONDUCTOR DEVICE AND METHOD OF MANUFACTURING THE SAME (71) Applicant: SK hynix Inc., Gyeonggi-do (KR)

(72) Inventor: Wan Cheul Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/219,501

(22) Filed: Jul. 26, 2016

(65) Prior Publication Data
US 2017/0243881 A1    Aug. 24, 2017

(30) Foreign Application Priority Data
Feb. 23, 2016 (KR) .................. 10-2016-0021303

(51) Int. Cl.
| H01L 27/115 | (2017.01) |
| H01L 27/11582 | (2017.01) |
| H01L 27/11556 | (2017.01) |
| H01L 21/3205 | (2006.01) |
| H01L 27/11565 | (2017.01) |
| H01L 21/768 | (2006.01) |
| H01L 27/11568 | (2017.01) |
| H01L 27/06 | (2006.01) |
| H01L 27/11578 | (2017.01) |
| H01L 21/762 | (2006.01) |
| H01L 27/1157 | (2017.01) |
| H01L 21/28 | (2006.01) |

(52) U.S. Cl.
CPC .. *H01L 27/11582* (2013.01); *H01L 21/28052* (2013.01); *H01L 21/32055* (2013.01); *H01L 21/768* (2013.01); *H01L 21/76224* (2013.01); *H01L 27/0688* (2013.01); *H01L 27/1157* (2013.01); *H01L 27/11556* (2013.01); *H01L 27/11565* (2013.01); *H01L 27/11568* (2013.01); *H01L 27/11578* (2013.01)

(58) Field of Classification Search
None
See application file for complete search history.

(56) References Cited

U.S. PATENT DOCUMENTS

| 2013/0270625 A1* | 10/2013 | Jang et al. | .......... H01L 29/7926 257/324 |
| 2016/0148947 A1* | 5/2016 | Seo et al. | .......... H01L 27/11565 257/324 |
| 2016/0343718 A1* | 11/2016 | Lu et al. | ............. H01L 27/1157 |
| 2017/0125540 A1* | 5/2017 | Park et al. | ............ H01L 29/513 |

FOREIGN PATENT DOCUMENTS

| KR | 101182942 | 9/2012 |
| KR | 1020130044711 | 5/2013 |

* cited by examiner

*Primary Examiner* — Minh-Loan Tran
(74) *Attorney, Agent, or Firm* — IP & T Group LLP (57) ABSTRACT

Disclosed is a method of manufacturing a semiconductor device, including: forming a stacked structure including first material layers and second material layers alternately stacked on each other; forming a pillar passing through the stacked structure, the pillar including a protruding portion protruding above an uppermost surface of the stacked structure; forming a conductive layer surrounding the protruding portion of the pillar; and forming a conductive pattern in contact with the protruding portion of the pillar by oxidizing a surface of the conductive layer.

13 Claims, 7 Drawing Sheets

SEMICONDUCTOR DEVICE AND METHOD OF MANUFACTURING THE SAME

CROSS-REFERENCE TO RELATED APPLICATION

The present application claims priority under 35 U.S.C. §119(a) to Korean patent application number 10-2016-0021303 filed on Feb. 23, 2016, which is incorporated herein by reference in its entirety.

BACKGROUND

1. Field

Various embodiments of the present invention relate generally to an electronic device and, more particularly, to a three-dimensional semiconductor device and a method of manufacturing the same.

2. Description of the Related Art

A non-volatile memory device is a memory device in which stored data is maintained even when the power supply to the device is turned off. Recently, improvements in the integration density of two-dimensional memory devices, in which memory cells are arranged in a single layer on a silicon substrate, have reached a limit. However, a three-dimensional (3D) non-volatile memory device has been proposed in which a plurality of memory cells are arranged in multiple layers in a 3D stacked structure. A 3D non-volatile memory device includes a vertical channel layer protruding from a substrate, and a plurality of memory cells stacked along a vertical channel layer. The 3D structure allows significant enhancement in the integration density of a semiconductor device, however it creates new challenges regarding its structure stability and performance characteristics.

SUMMARY OF THE INVENTION

Various embodiments of the present invention are directed to an improved 3D, semiconductor device and a method of manufacturing the same, the semiconductor device including a plurality of transistors having enhanced uniformity, structural stability and degree of integration.

An exemplary embodiment of the present disclosure provides a semiconductor device, including: a stacked structure including conductive layers and insulating layers alternately stacked on each other; an insulating layer on the stacked structure; pillars including an insulating pattern passing through a part of the insulating layer and the stacked structure, a channel pattern surrounding a side wall of the insulating pattern, and a memory pattern surrounding a side wall of the channel pattern; and conductive patterns which are in contact with the pillars, respectively, and are formed within the insulating layer.

Another exemplary embodiment of the present disclosure provides a method of manufacturing a semiconductor device, including: forming a stacked structure including first material layers and second material layers alternately stacked on each other; forming a pillar passing through the stacked structure, the pillar including a protruding portion protruding above an uppermost surface of the stacked structure; forming a conductive layer surrounding the protruding portion of the pillar; and forming a conductive pattern in contact with the protruding portion of the pillar by oxidizing a surface of the conductive layer.

According to the exemplary embodiments of the present disclosure, it is possible to form the pillars and the conductive patterns having uniform heights. Accordingly, a distance between a gate electrode of a select transistor and a junction, so that the select transistors have a uniform characteristic.

BRIEF DESCRIPTION OF THE DRAWINGS

Example embodiments will now be described more fully hereinafter with reference to the accompanying drawings in which.

DETAILED DESCRIPTION OF THE INVENTION

Hereinafter, various embodiments of the present invention will be described. However, it is noted that the present invention may be embodied in different other embodiments and variations thereof and should not be construed as being limited to the embodiments set forth herein. Rather, these embodiments are provided so that the disclosure of the present invention will be thorough and complete.

In the drawings, the thicknesses and the intervals of elements are exaggerated for convenience of illustration, and may be exaggerated compared to an actual physical thickness.

In describing the present invention, well-known features peripheral to the principal point of the present invention may be omitted. It should also be noted that in giving reference numerals to elements of each drawing, like reference numerals refer to like elements even though like elements are shown in different drawings.

It will be understood that when an element is referred to as being "between" two elements, it can be the only element between the two elements, or one or more intervening elements may also be present.

It will be further understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 1A:
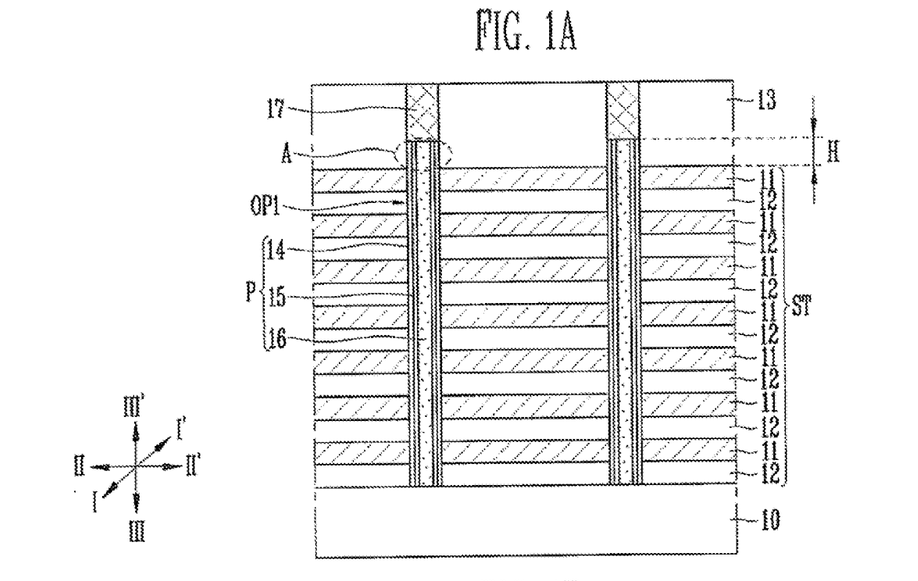
FIGS. 1A and 1S are cross-sectional views illustrating a structure of a semiconductor device, according to an embodiment of the present invention.
Figure 1B:
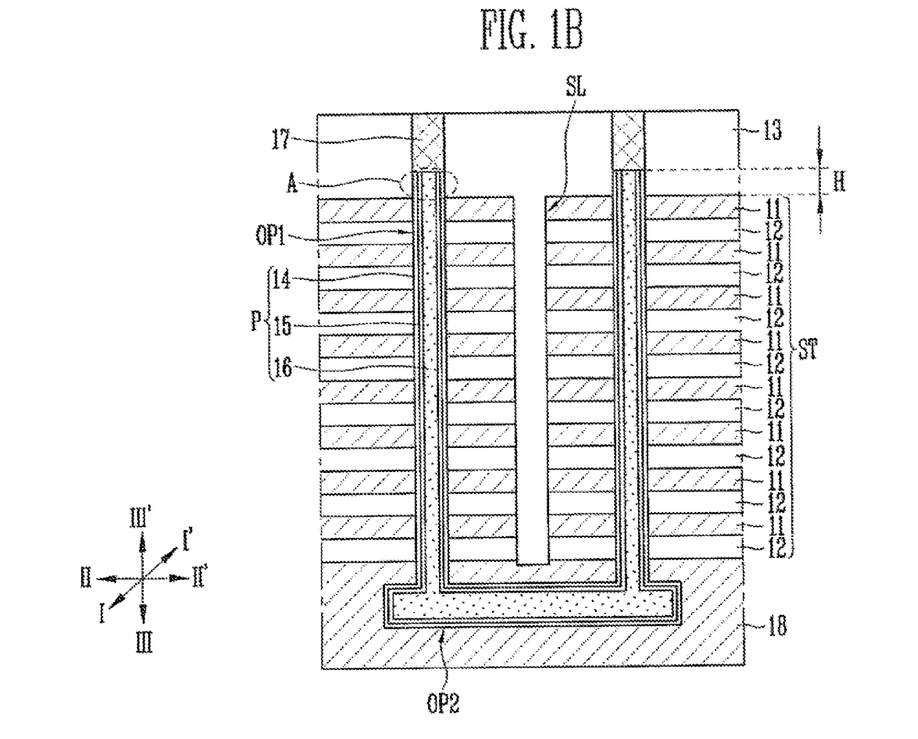

FIGS. 1A and 1B are cross-sectional views illustrating a structure of a semiconductor device according to an exemplary embodiment of the present disclosure.

Referring to FIGS. 1A and 1B, a semiconductor device according to an embodiment of the present invention may be or include, for example, a stacked structure ST, a pillar P passing through the stacked structure, and a conductive pattern 17 in contact with the pillar P.

The stacked structure ST may be or include, for example, conductive layers 11 and insulating layers 12 alternately stacked on each other along a third direction III-III. The third direction is a direction perpendicular to the plane of the substrate (not shown) defined by first and IQ second directions I-I' AND II-II'. The conductive layers 11 may be gate electrodes of a select transistor, memory cell, and the like, and may be or include, for example, tungsten W, a tungsten nitride (WNx), titanium (Ti), a titanium nitride (TiN), tantalum (Ta), a tantalum nitride (TaN), polysilicon, a silicide, and the like. The insulating layers 12 may be used for insulating the stacked gate electrodes from each other, and may be or include, for example, an oxide and the like. The conductive and insulating layers extend in the first and second directions I-I' and II-II'.

The pillar P extends in the third and second directions III-III', and II-II'. The pillar P may be or include, for example, a channel pattern 15, a memory pattern 14, and a gap-fill insulating pattern 16 formed within the opening OP1 passing through the stacked structure ST in a stack direction, i.e., the third direction. The memory pattern 14 may surround a side wall of the channel pattern 15, and a core region: of the channel pattern 15 may be opened. The gap-fill insulating pattern 16 may be filled in the opened core region of the channel pattern 15. The channel pattern 15 may be a channel layer of the select, transistor, memory cell, and the like, and may be or include, for example, a semiconductor material, such as silicon (Si) or germanium (Ge). The memory pattern 14 may be or include, for example, a tunnel insulating layer, a data storing layer, and a charge blocking layer. The data storing layer may be or include, for example, a floating gate, such as polysilicon, a charge trap material, such as a nitride, a phase change material, a nano dot, and the like. The gap-fill insulating pattern 16 may be or include, for example, an oxide, such as poly Silazane (PSZ).

Further, the pillar P may be or include, for example, a us protruding portion A protruding above an uppermost surface of the stacked structure ST. For example, an uppermost surface of the pillar P may be positioned higher than the uppermost surface of the stacked structure ST. The protruding portion A of the pillar P may be positioned within: an insulating layer 13 positioned on: the stacked structure ST.

The conductive pattern 17 may be positioned within the insulating layer 13, and may be formed on the protruding portion A of the pillar P. Hence, as illustrated in FIG. 1A, the conductive pattern 17 may have a lowermost surface abutting the uppermost surface of the pillar 15. The conductive pattern 17 may also have an uppermost surface which is at the same level as the uppermost surface of the insulating layer 13. The conductive pattern 17 may be used for connecting the channel pattern 15 with a wire (not illustrated) during a driving of a memory string. Accordingly, the conductive pattern 17 may be in direct contact with the channel pattern 15 so as to directly apply a bias to the channel pattern 15. The conductive pattern 17 may be or include, for example, polysilicon, tungsten W, tungsten nitride (WNx), titanium (Ti), a titanium nitride (TiN), tantalum (Ta), a tantalum nitride (TaN), silicide, and the like. Further, the conductive pattern 17 may be or include, for example, a junction doped with impurities.

As illustrated in FIG. 1A, them are two pillars 15 and two conductive patterns 17. According to the illustrated embodiment, each pillar P and each conductive pattern 17 may have uniform heights, and thus heights H from the uppermost conductive layer 11 to the conductive patterns 17 may have a uniform value. For example, the heights H from the top surface of the uppermost (top) conductive layer 11 to the lowermost surfaces of the conductive patterns 17 may have a uniform value, and the protruding portions A of the pillars 15 may have a uniform height. When the top conductive layer 11 is a gate electrode of the select transistor, a distance between the gate electrode and the junction of the conductive pattern 17 may be determined according to the height H, thus if this height were not the same for all the conductive patterns it would change the operation characteristic of the select transistors. When the heights H between the top conductive layer 11 and the conductive patterns 17 are not uniform, the characteristic of the select transistors would not be uniform, causing a characteristic of the semiconductor device to be degraded. Accordingly, the select transistors may have a uniform characteristic by arranging the pillars P and the conductive patterns 17 so that the heights H may have a uniform value, thereby preventing a characteristic of the semiconductor device from being degraded.

FIG. 1A is a cross-sectional view illustrating a structure of a memory string to which the pillar P and the conductive patterns 17, according to an embodiment of the present invention, in which a memory string may be arranged in an "I" form. The channel pattern 15 may be formed within the first opening OP1 in the form of "I". The memory cells may be stacked along the channel pattern 15. At least the top conductive layer among the conductive layers 11 may be a gate electrode of an upper select transistor, at least the lowest conductive layer among the conductive layers 11 may be a gate electrode of a lower select transistor, and the remaining conductive layers 11 may be gate electrodes of the memory cells. Further, a source layer 10 may be positioned under the stacked structure ST and may be in contact with the channel pattern 15. In this case, one memory string may include for example, one or more lower select transistors, a plurality of memory cells, and one or more upper select transistors, which are serially connected.

FIG. 1B is a cross-sectional view illustrating a structure of a memory string to which the pillar P and the conductive patterns 17 according to an embodiment of the present invention may be applied, in which the memory string may be arranged in: a "U" form. The channel pattern 15 may be formed within the first and second openings OP1 and OP2 in the form of "U". The memory cells may be stacked along the channel pattern 15. At least the uppermost conductive layer 11 among the conductive layers 11 may be a gate electrode of drain and source select transistors. The remaining conductive layers 11 may be gate electrodes of the memory cells. Further, a conductive layer 18 for a pipe gate may be positioned under the stacked structure ST. The insulating layer 13 may be filled within a slit SL positioned between the adjacent first openings OP. In this case, one memory string may include, for example, one or more source select transistors, a plurality of source side memory cells, a pipe transistor, a plurality of drain side memory cells, and one or more drain select transistors which are serially connected.

The present invention is applicable to various types of semiconductor device including a channel pattern passing through a stacked structure and a conductive pattern connected to the channel pattern. For example, the present invention is applicable to a memory device, such as a Dynamic Random Access Memory (DRAM), a NAND FLASH, a NOR FLASH, a Resistive Random Access Memory (RRAM), a Phase-change Random Access Memory (PRAM), a Ferroelectric Random Access Memory (FRAM), a Magnetic Random Access Memory (MRAM), and an E-fuse.

FIGS. 2A to 2H are cross-sectional views for describing a us method of manufacturing the semiconductor device, according to an embodiment of the present invention.

Figure 2A:
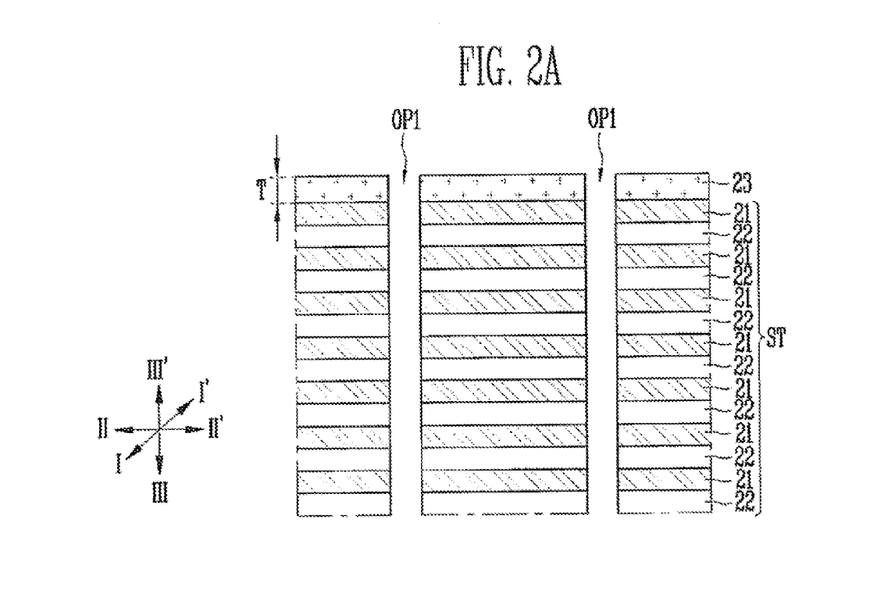
FIGS. 2A to 2H are cross-sectional views for describing a method of manufacturing the semiconductor device, according to an embodiment of the present invention.

Referring to FIG. 2A, a stacked structure ST including first material layers 21 and second material layers 22 alternately stacked on each other along the third direction III-III' may be formed. The first material layers 21 may extend in the first and second directions I-I' and II-II' and may be used for forming a gate electrode of a memory cell or a select transistor. The second material layers 22 may extend in the first and second directions I-I' and II-II' and may be used for forming an insulating layer insulating the stacked gate electrodes from each other. The first material layers 21 may be or include, for example, a sacrificial material, such as a nitride. The second material layers 22 may be or include, for example, an insulating material, such as an oxide. For another example, the first material layers 21 may be or include a conductive material, such as polysilicon, and the second material layers 22 may be or include an insulating material, such as an oxide. For yet another example, the first material layers 21 may be or include a conductive material, such as doped polysilicon, and the second material layers 22 may be or include sacrificial layers, such as un-doped polysilicon.

Next, a sacrificial layer 23 may be formed on the stacked us structure ST. The sacrificial layer 23 may be or include, for example, a material having a higher etch selectivity with respect to the first and second material layers 21 and 22. For example, when the first material layer 21 is a silicon oxide, and the second material layer is a silicon nitride, the sacrificial layer 23 may be a titanium nitride (TiN).

A height of a protruding portion of a pillar to be formed in a subsequent process may be determined according to a thickness T of the sacrificial layer 23. For example, a height between a conductive pad and the uppermost conductive layer to be formed in a subsequent process may be determined according to a thickness T of the sacrificial layer 23. Accordingly, the thickness T of the sacrificial layer 23 is desirable to be determined considering a characteristic of the select transistor.

Next, first openings OP1 passing the sacrificial layer 23 and the stacked structure ST may be formed. The first openings OP1 may be formed in depths, in which the first material layers 21 are all exposed. The IQ first openings OP1 may have a circular, elliptical, quadrangular, or polygonal cross-section.

Figure 2B:
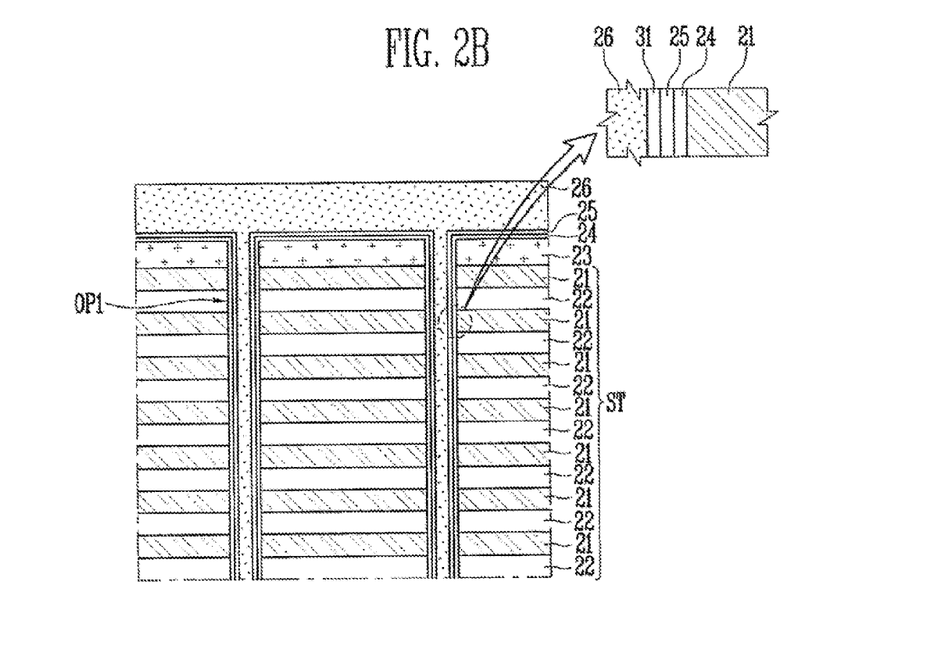

Referring to FIG. 2B, a memory layer 24 and a channel layer 25 may be sequentially formed along a profile of a resultant structure including the first openings OP1. The memory layer 24 and the channel layer 25 may be formed within the first opening OP1 and on the sacrificial layer 23. The memory layer 24 may include a charge blocking layer, a data storing layer, and a tunnel insulating layer which: are sequentially stacked. In a variation of the present, embodiment, the memory layer may include at least one of a charge blocking layer a data storing layer, and a tunnel insulating layer. Further, the memory layer 24 and the channel layer 25 may be formed in suitable thicknesses, in which the first opening OP1 is not completely filled. For example, a buffer layer may be formed before forming the memory layer 24, and the buffer layer may be or include, for example, an oxide.

Next, a gap-fill insulating layer 26 may be formed. The gap-fill insulating layer 26 may be formed within the channel layer 25 to be filled in the first opening OP1, and may be formed on the sacrificial layer 23. The gap-fill insulating pattern 26 may be or include, for example, poly silazane (PSZ). The gap-fill insulating layer 26 may be formed by coating a IQ flowing oxide layer, such as PSZ, so as to be filled in the first opening OP1 and then curing the flowing oxide layer by a curing process. Before the gap-fill insulating layer 26 is formed, a liner oxide layer 31 may be formed on the channel layer 25. The liner oxide layer 31 may be formed, so that it is possible to decrease a trap site positioned on an interface between the channel layer 25 and the gap-fill insulating layer 26.

Figure 2C:
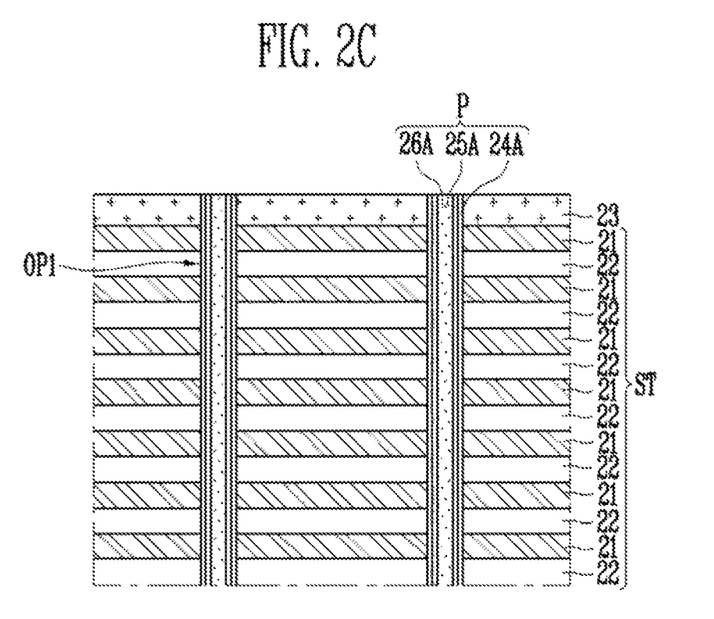

Referring to FIG. 2C, a gap-fill insulating pattern 26A, a channel pattern 25A, and a memory pattern 24A may be formed by planarizing the gap-fill insulating layer 26, the channel layer 25, and the memory layer 24 until a surface of the sacrificial layer 23 is exposed. Accordingly, a pillar P positioned within the first opening OP1 and including the gap-fill insulating pattern 26A, the channel pattern 25A, and the memory pattern 24A may be formed.

In this case, the planarizing process may be performed based on a flat upper surface of the sacrificial layer 23, so that the pillars P may have uniform heights. For example, the gap-fill insulating pattern 26A, the channel pattern 25A, and the memory pattern 24A may have uniform heights.

Figure 2D:
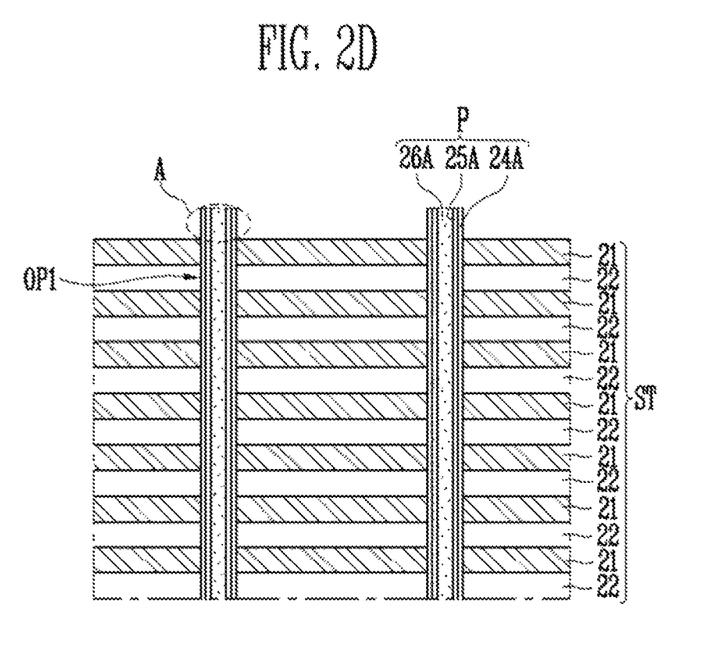

Referring to FIG. 2D, the sacrificial layer 23 may be removed. For example, the pillar P may be partially exposed from the upper surface of the stacked structure ST by selectively etching the sacrificial layer 23. Here, a part of the pillar P protruding from the upper surface of the stacked structure ST is referred to as a protruding portion A.

Figure 2E:
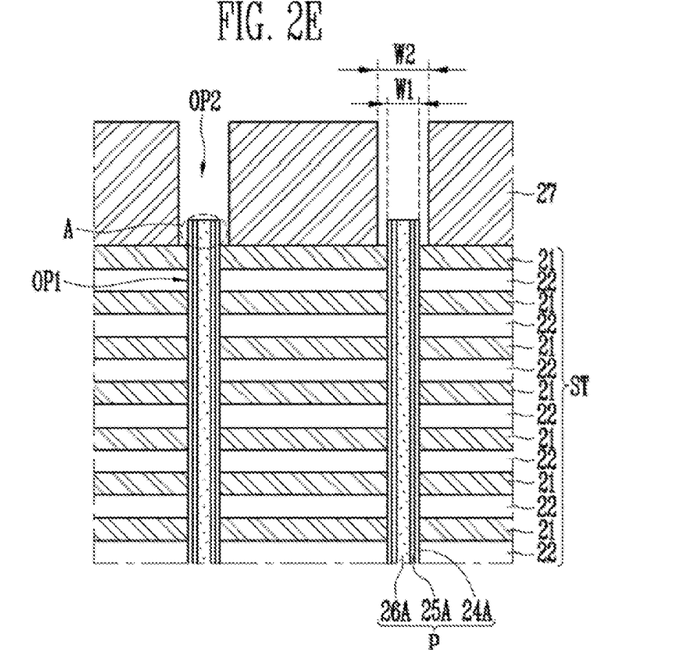

Referring to FIG. 2E, a mask pattern 27 including a second opening OP2 may be formed on the stacked structure ST. The mask pattern 27 may be or include, for example, amorphous carbon or an oxide. The mask pattern 27 may be formed, for example, by forming a photoresist pattern on a material layer for a mask and then etching the material layer for the mask using the photoresist pattern as an etch: barrier.

The second opening OP2 of the mask pattern 27 may be an area for forming a conductive pattern in a subsequent process. The second openings OP2 may be arranged so as to expose the protruding portions A, respectively. A thickness of the mask pattern 27, and a width W2 of the second opening may be determined considering a size of a conductive pattern which is desired to be finally formed by oxidizing the conductive layer. For example, the second opening OP2 may have the same width (W1=W2) as the protruding portion A, or may have a larger width (W1>W2) as the protruding portion A.

Figure 2F:
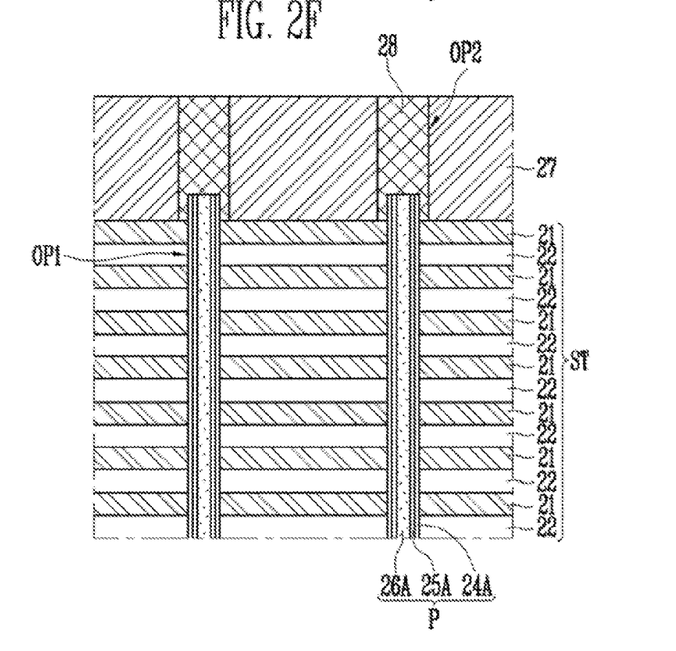

Referring to FIG. 2F, a conductive layer 28 may be formed within the second opening OP2. For example, the conductive layer 28 may be deposited on the mask pattern 27 to fill the second opening OP2 and then the conductive layer 28 may be planarized until a surface of the mask pattern 27 is exposed so that the conductive layer 28 formed on an upper surface of the mask pattern 27 may be removed. The planarizing process may be performed based on a flat upper surface of the mask pattern 27, so that it is possible to form the conductive layers 28 with a uniform height.

Figure 2G:
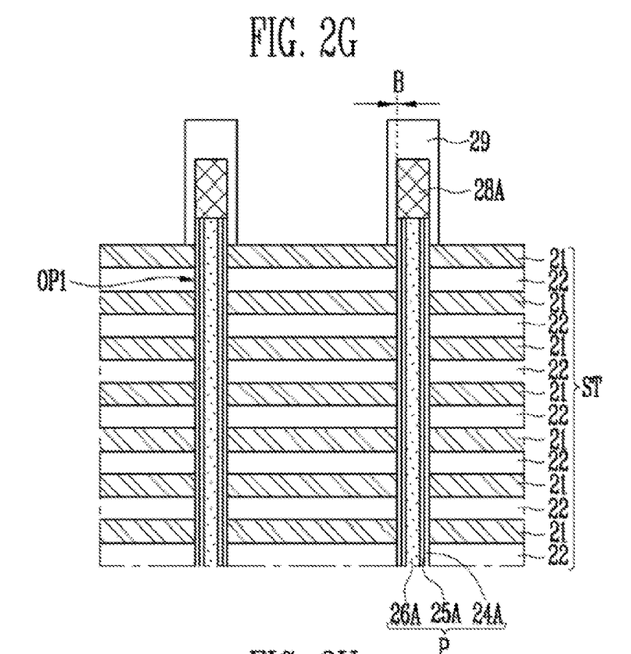

Referring to FIG. 2G, the conductive layer 28 may be exposed by removing the mask pattern 27. Then, a conductive pattern 28A and an oxide pattern 29 may be formed by oxidizing a surface of the conductive layer 28. In this case, the entire surface of the conductive layer 28 may be oxidized by a predetermined thickness. The oxidized area of the conductive layer 28 may become the oxide pattern 29, and the remaining non-oxidized region of the conductive layer 28 may become the conductive pattern 28A. The conductive pattern 28A may be used as a pad or an electrode for directly applying a bias to the channel pattern 25A. Accordingly, the conductive pattern 28A may be in direct contact with the protruding portion A, particularly, the channel pattern 25A.

In this case, a final size of the conductive pattern 28A may be determined by adjusting an oxidation degree of the conductive layer 28 according to a condition of an oxidation process, such as a temperature or time. For example, an oxidation thickness of the conductive layer 28 may be adjusted so that an edge B of the conductive pattern 28A may be substantially matched to an edge of the pillar P. In this case, the conductive pattern 28A and the pillar P may have substantially the same width. The term "substantially the same width" means that width values which differ less than the error tolerance of the process are considered to be the same. For another example, an oxidation thickness of the conductive layer 28 may be adjusted so that the edge B of the conductive pattern 28A may be substantially matched to the edge of the channel pattern 25A. In this case, the conductive pattern 28A may have a smaller width than the pillar P, and the conductive pattern 28A and the channel pattern 25A may substantially have the same width. For another example, an oxidation thickness of the conductive layer 28 may be adjusted so that the conductive pattern 28 A has a larger width than the pillar P. In this case, the conductive pattern 28A may have a larger width than that of the pillar P.

As described above, it is possible to oxidize the conductive layers 28 to have the uniform thickness by performing an oxidation process in a state where the entire surfaces of the conductive layers 28 are exposed. Accordingly, it is possible to form the conductive patterns 28A having substantially uniform height and width.

Figure 2H:
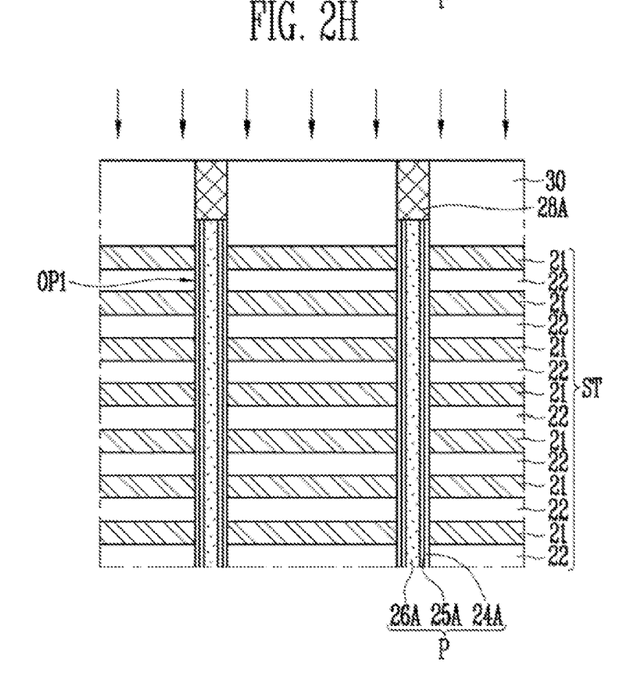

Referring to FIG. 2H, an insulating layer 30 may be formed on the stacked structure ST so as to cover the conductive pattern 28A. In this case, the insulating layer 30 may be formed after removing the oxide pattern 29, or in a state where the oxide pattern 29 remains. Next, the insulating layer 30 may be planarized so that the upper surface of the conductive pattern 28A may be exposed.

Next, impurities may be doped in the conductive pattern 28A. For example, a junction may be formed within the conductive pattern 28A by injecting the impurities into the conductive pattern 28A using an ion injecting process. The junction may be entirely or partially formed within the conductive pattern 28A.

In the meantime, although not illustrated in the drawing, an additional process may be performed according to properties of the first and second material layers 21 and 22. For example, when the first material layers 21 are the sacrificial layers and the second material layers 22 are the insulating layers, processes of forming a slit passing through the stacked structure ST and replacing the first material layers 21 with the conductive materials through the slit may be performed. For another example, when the first material layers 21 are the conductive layers and the second material layers 22 are the insulating layers, processes of forming a slit passing through the stacked structure ST and siliciding the first material layers 21 through the slit may be performed. For another example, when the first material layers 21 are the conductive layers and the second material layers 22 are the sacrificial layers, processes of forming a slit passing through the stacked structure ST and replacing the second material us layers 22 with the insulating layers through the slit may be performed.

According to the aforementioned process, it is possible to form the pillars P having uniform height and the conductive patterns 28A having uniform size. Accordingly, the transistors manufactured by the aforementioned process may have a uniform characteristic.

When the gap-fill insulating layers formed within the first openings are etched and the conductive patterns are formed within the etched regions, it is difficult to control an etch depth of the gap-fill insulating layer. Accordingly, the heights of the gap-fill insulating layers 26A may become non-uniform, and the sizes of the conductive patterns may also become non-uniform. In this case, since the characteristic of the transistor becomes non-uniform, a characteristic of the semiconductor device may be also degraded. By contrast, according to an embodiment of the present invention, it is possible to form the pillars P having uniform height and the conductive patterns 28A having uniform size, so that it is possible to improve the degradation of the characteristic of the semiconductor device.

Figure 3:
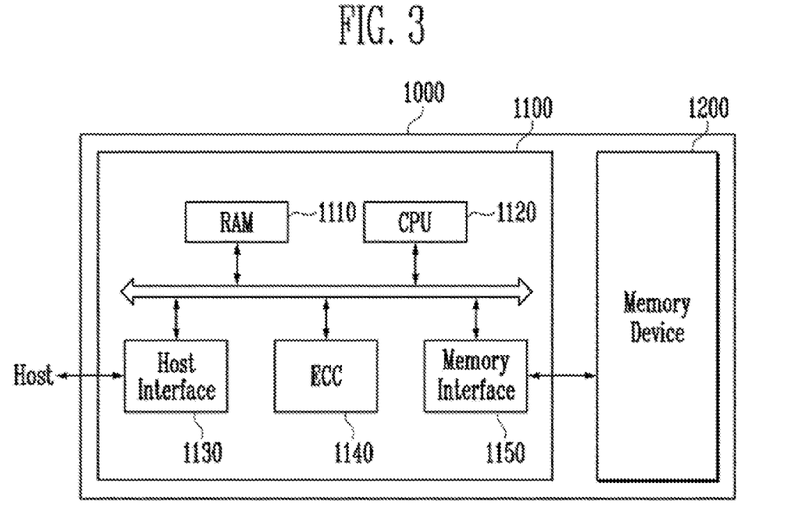
FIGS. 3 and 4 are block diagrams illustrating a configuration of a memory system, according to an embodiment of the present invention.

Referring now to FIG. 3, a memory system 1000 according to an exemplary embodiment of the present invention may include a memory device 1200 and a controller 1100.

The memory device 1200 may be used for storing data us information having various data forms, such as text, graphic, and software codes. The memory device 1200 may be a non-volatile memory, and may include the structures described above with reference to FIGS. 1A to 2H. Further, the memory device 1200 may include: a stacked structure including conductive layers and insulating layers alternately stacked on each other; an insulating layer on the stacked structure; pillars including an insulating pattern entering into a part of the insulating layer and the stacked structure, a channel pattern surrounding a side wall of the insulating pattern, and a memory pattern surrounding a side wall of the channel pattern; and conductive patterns which are in contact with the pillars, respectively, and are formed within the insulating layer. A structure and the manufacturing method of the memory device 1200 may be the same as those described above. Accordingly, detailed descriptions thereof will be omitted.

The controller 1100 may be connected to a host and the memory device 1200. The controller 1100 may access the memory device 1200 in response to a request from the host.

For example, the controller 1100 may control at least one of a read, write, erase, and background operations of the memory device 1200.

The controller 1100 may include a Random Access Memory (RAM) 1100, a Central Processing Unit (CPU) 1120, a host interface 1130, an Error Correction Code (ECC) circuit 1140, a memory interface 1150, and the like.

The RAM 1110 may be used as an operation memory of the CPU 1120, a cache memory between the memory device 1200 and the host, a buffer memory between the memory device 1200 and the host, and the like. For example, the RAM 1100 may be replaced with a Static Random Access Memory (SRAM), a Read Only Memory (ROM), and the like.

The CPU 1120 may control the operation: of the controller 1100. For example, the CPU 1120 may operate firmware, such as a Flash Translation Layer (FTL), stored in the RAM 1110.

The host interface 1130 may perform interfacing with the host. For example, the controller 1100 may communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an IQ Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The ECC circuit 1140 may detect and correct an error included us in data read from the memory device 1200 by using an error correction code.

The memory interface 1150 may perform interfacing with the memory device 1200. For example, the memory interface 1150 may be or include, for example, a NAND interface or a NOR interface.

For example, the controller 1100 may further include a buffer memory (not illustrated) for temporarily storing data. The buffer memory may be used for temporarily storing data transmitted to an external device through the interface 1130, or temporarily storing data transmitted from the memory device 1200 through the memory interface 1150. Further, the controller 1100 may further include an ROM storing code data for interfacing with the host.

As described above, the memory system 1000 according to an embodiment of the present invention may include the memory device 1200 including transistors having an improved, more uniform structure, more uniform performance characteristics and an improved degree of integration, thereby improving the overall structural stability, the operational characteristics and the degree of integration of the memory system 1000.

Figure 4:
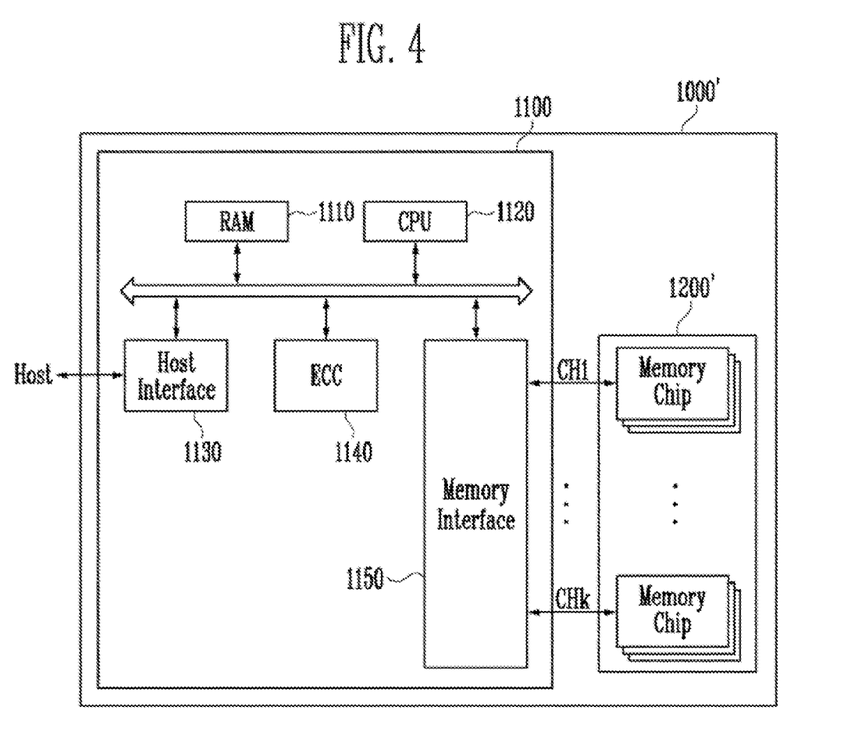

Referring to FIG. 4, a memory system 1000' according to an embodiment of the present invention may include a memory device 1200' and a controller 1100. Further, the controller 1100 may include a RAM 1110, a CPU 1120, a host interface 1130, an ECC circuit 1140, a memory interface 1150, and the like. Hereinafter, contents overlapping the aforementioned description will be omitted.

The memory device 1200' may be a non-volatile memory, and may include a memory string as described above with reference to FIGS. 1A to 2H. Further, the memory device 1200' may include: a stacked structure including conductive layers and insulating layers which are alternately stacked; an insulating layer on the stacked structure; pillars including an insulating pattern passing through a part of the insulating layer and the stacked structure, a channel pattern surrounding a side wall of the insulating pattern, and a memory pattern surrounding a side wall of the channel pattern; and conductive patterns which are in contact with the pillars, respectively, and are formed within the insulating layer. A structure and the manufacturing method of the memory device 1200' may be the same as those described above. Accordingly, detailed descriptions thereof will be omitted.

Further, the memory device 1200' may be a multi-chip package formed of a plurality of memory chips. The plurality of memory chips may be classified into a plurality of groups. The plurality of groups may communicate with the controller 1100 through first to $k^{th}$ channels CH1 to Ck. Further, the memory chips included in one group may communicate with the controller 1100 through a common channel. For example, the memory system 1000' may be modified so that one memory chip may be connected to one channel.

As described above, the memory system 1000' according to an embodiment of the present invention may be or include, for example, the memory device 1200' including transistors having a more uniform structure, more uniform operational characteristics and an improved degree of integration, thereby improving the overall structural stability, operational characteristics and degree of integration of the memory system 1000' For example, the memory device 1200' may be formed in multi-chip package configuration for increasing the data storage capacity of the memory system 1000' and improving its driving speed.

Figure 5:
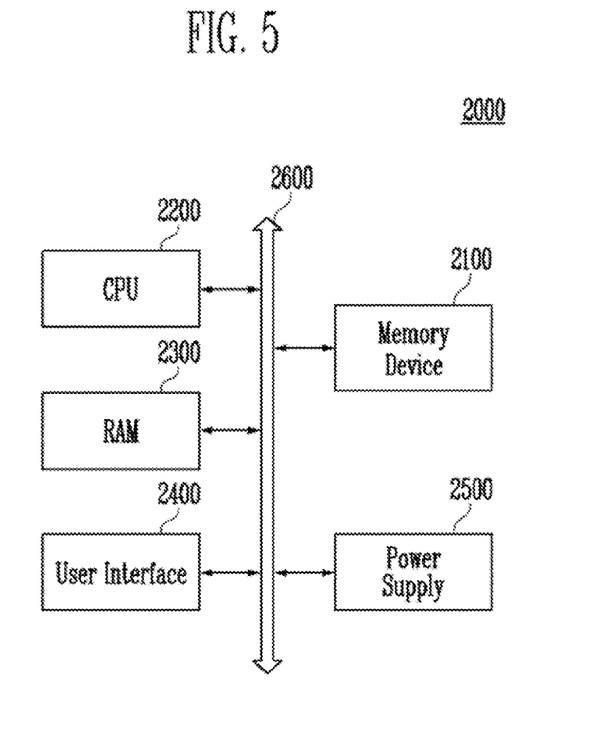
FIGS. 5 and 6 are block diagrams illustrating a configuration of a computing system, according to an embodiment of the present invention.

As illustrated in FIG. 5, a computing system 2000 according to an exemplary embodiment of the present invention may include a memory device 2100, a CPU 2200, a RAM 2300, a user interface 2400, a power supply 2500, a system bus 2600, and the like. Hereinafter, contents overlapping the aforementioned description will be omitted.

The memory device 2100 may store data provided through the us user interface 2400, data processed by the CPU 2200, and the like. Further, the memory device 2100 may be electrically connected to the CPU 2200, the RAM 2300, the user interface 2400, and the power supply 2500 through the system bus 2600. For example, the memory device 2100 may be connected to the system bus 2600 through a controller (not illustrated), or may be directly connected to the system bus 2600. When the memory device 2100 is directly connected to the system bus 2600, a function of the controller may be performed by the CPU 2200, the RAM 2300, and the like.

The memory device 2100 may be a non-volatile memory, and may include a memory string described above with reference to FIGS. 1A to 2H. Further, the memory device 2100 may include: a stacked structure including conductive layers and insulating layers which are alternately stacked; an insulating layer on the stacked structure; pillars including an insulating pattern passing through a part of the insulating layer and the stacked structure, a channel pattern surrounding a side wall of the insulating pattern, and a memory pattern surrounding a side wall of the channel pattern; and conductive patterns which are in contact with the pillars, respectively, and formed within the insulating layer A structure and the manufacturing method of the memory device 2100 may be the same as those described above. Accordingly, detailed descriptions thereof will be omitted.

Further, the memory device 2100 may be a multi-chip package formed of a plurality of memory chips as described above with reference to FIG. 4.

The computing system 2000 including the aforementioned configuration may be or include, for example, a computer, an Ultra Mobile PC (UMPC), a workstation, a net-book computer personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3D television, a digital audio recorder, a digital audio player, a digital picture recorder, a digital picture player, a digital video recorder, a digital video player, a device capable transceiving information in: a wireless environment, one of various electronic devices configuring a home network, one of various electronic devices configuring a computer network, one of IQ various electronic devices configuring a telematics network, an RFID device, and the like.

As described above, the computing system 2000 according to an embodiment of the present invention may include the memory device 2100 including transistors having a more uniform structure, a more uniform characteristic and an improved degree of integration, thereby improving the overall uniformity, operational characteristics and data storage capacity of the computing system 2000.

Figure 6:
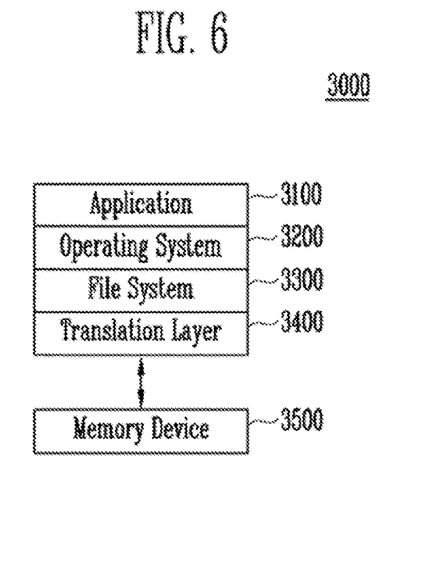

As illustrated in FIG. 6, a computing system 3000 according to an exemplary embodiment of the present invention may include a software layer including an operating system 3200, an application 3100, a file system 3300, a translation layer 3400, and the like. Further, the computing system 3000 may include a hardware layer, such as a memory device 3500.

The operating system 3200 may be provided for managing software and hardware sources, and the like of the computing system 3000, and may control an execution of a program of a CPU. The application 3100 may be various application programs executed in the computing system 3000, such as a utility executed by the operation system 3200.

The file system 3300 may indicate a logical structure for managing data, a file, and the like present in the computing system 3000, and may organize a file or data to be stored in the memory device 3500 and the like according to a rule. The file system 3300 may be determined by the operation system 3200 used in the computing system 3000. For example, when the operation system 3200 is a series of Windows of the Microsoft Company, the file system 3300 may be a File Allocation Table (FAT), a NT file system (NTFS), and the like. Further, when the operation system 3200 is a series of Unix/Linux, the file system 3300 may be an Extended File System (EXT), a Unix File System (UFS), a Journaling File System (JFS), and the like.

In the present drawings, although the operation system 3200, the application 3100, and the file system 3300 are illustrated as separate blocks, the application 3100 and the file system 3300 may be included in the operation system 3200.

The translation layer 3400 may translate addresses into a form appropriate to the memory device 3500 in response to a request from the file system 3300. For example, the translation layer 3400 may translate logic addresses generated by the file system 300 into a physical address of the memory device 3500. The mapping information of the logic addresses and the physical addresses may be stored in an address translation table. For example, the translation layer 3400 may be a Flash Translation Layer (FTL), a Universal Flash Storage Link Layer (ULL), and the like.

The memory device 3500 may be a non-volatile memory, and may include a memory string as described above with reference to FIGS. 1A to 2H. Further, the memory device 3500 may include: a stacked structure including conductive layers and insulating layers which are alternately stacked; an insulating layer on the stacked structure; pillars including an insulating pattern passing through a part of the insulating layer and the stacked structure, a channel pattern surrounding a side wall of the insulating pattern, and a memory pattern surrounding a side wall of the channel pattern; and conductive patterns which are in contact with the pillars, respectively, and formed within the insulating layer A structure and the manufacturing method of the memory device 3500 may be the same as those described above. Accordingly, detailed descriptions thereof will be omitted.

The computing system 3000 including the aforementioned configuration may be divided into an operation system layer performed in a high level region and a controller layer performed in a low level region. The application 3100, the operation system 3200, and the file system 3300 may be included in the operation system layer, and may be driven by an operation memory of the computing system 300. Further, the translation layer 3400 may be included in the operation system layer or the controller layer.

As described above, the computing system 3000 according to an embodiment of the present invention may include the memory device 3500 including transistors having a more uniform structure, a more uniform operational characteristic and an improved degree of integration, thereby improving the overall uniformity and operational characteristics and data storage capacity of the computing system 3000.

The present disclosure has been described according to various embodiments in sufficient detail to enable those skilled in the art to which this invention pertains to make and use the invention. However, as noted, the described embodiments are provided for purposes of illustration only and are not intended to limit the present invention. Those skilled in the art to which the present invention pertains may envisage various other embodiments and variations thereof within the technical spirit and scope of the present invention as defined in the appended claims.

What is claimed is:

1. A method of manufacturing a semiconductor device, the method comprising:
   forming a stacked structure including first material layers and second material layers alternately stacked on each other;
   forming a pillar passing through the stacked structure, the pillar including a protruding portion protruding above an uppermost surface of the stacked structure;
   forming a conductive layer surrounding the protruding portion of the pillar; and
   forming a conductive pattern in contact with the protruding portion of the pillar by oxidizing a surface of the conductive layer.

2. The method of claim 1, wherein the forming of the pillar includes:
   forming a sacrificial layer on the stacked structure;
   forming the pillar passing through the stacked structure and the sacrificial layer; and
   removing the sacrificial layer so that the protruding portion of the pillar is exposed.

3. The method of claim 2, wherein the forming of the pillar includes:
   forming an opening passing through the stacked structure and the sacrificial layer;
   sequentially forming a memory layer, a channel layer, and a gap-fill insulating layer within the opening and on the sacrificial layer; and planarizing the gap-fill insulating layer, the channel layer, and the memory layer until a surface of the sacrificial layer is exposed.

4. The method of claim 3, further comprising:
forming a liner oxide layer on the channel layer before the forming of the gap-fill insulating layer.

5. The method of claim 2, wherein the sacrificial layer includes a material having a higher etch selectivity with respect to the first and second material layers.

6. The method of claim 2, wherein the sacrificial layer includes a titanium nitride (TiN).

7. The method of claim 1, wherein the forming of the conductive layer includes:
forming a mask pattern including an opening through which the protruding portion is exposed; and
forming the conductive layer within the opening.

8. The method of claim 7, wherein the forming of the conductive layer includes:
depositing the conductive layer within the opening and on the mask pattern; and
planarizing the conductive layer until a surface of the mask pattern is exposed.

9. The method of claim 1, wherein: the conductive layer includes polysilicon.

10. The method of claim 1, wherein the forming of the conductive pattern includes oxidizing the conductive layer by a predetermined thickness so that an edge of the conductive pattern is matched to an edge of the pillar.

11. The method of claim 1, further comprising:
forming an insulating layer on the stacked structure after the forming of the conductive pattern.

12. The method of claim 11, wherein the forming of the insulating layer includes:
forming the insulating layer on the stacked structure; and
planarizing the insulating layer until a surface of the conductive pattern is exposed.

13. The method of claim 1, further comprising:
forming a junction within the conductive pattern by doping impurities in the conductive pattern.

* * * * *